(12) United States Patent
Yang

(10) Patent No.: US 10,839,923 B1
(45) Date of Patent: Nov. 17, 2020

(54) PREDICTIVE BOOSTING FOR 3D NAND

(71) Applicant: SanDisk Technologies LLC, Addison, TX (US)

(72) Inventor: Xiang Yang, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/434,436

(22) Filed: Jun. 7, 2019

(51) Int. Cl.
*G11C 16/06* (2006.01)
*G11C 16/34* (2006.01)
*G11C 16/26* (2006.01)
*G11C 11/56* (2006.01)
*G11C 16/16* (2006.01)
*G11C 16/08* (2006.01)
*G11C 16/24* (2006.01)
*G11C 7/12* (2006.01)
*G11C 7/00* (2006.01)

(52) U.S. Cl.
CPC ...... *G11C 16/3431* (2013.01); *G11C 11/5635* (2013.01); *G11C 11/5642* (2013.01); *G11C 16/08* (2013.01); *G11C 16/16* (2013.01); *G11C 16/24* (2013.01); *G11C 16/26* (2013.01); *G11C 16/3445* (2013.01); *G11C 7/00* (2013.01); *G11C 7/12* (2013.01)

(58) Field of Classification Search
CPC . G11C 16/0483; G11C 16/3459; G11C 16/12; G11C 16/30; G11C 16/3454; G11C 16/3418; G11C 16/3427; G11C 11/5628; G11C 11/5642; G11C 16/08; G11C 16/24; G11C 16/26; G11C 11/5635; G11C 11/5671; G11C 16/10; G11C 16/16; G11C 16/3445; G11C 2029/0409; G11C 2029/1202; G11C 2029/1204
USPC .............................................................. 1/1
See application file for complete search history.

(56) References Cited

U.S. PATENT DOCUMENTS

2008/0068891 A1* 3/2008 Guterman .............. G11C 16/30
365/185.17

* cited by examiner

*Primary Examiner* — Thong Q Le
(74) *Attorney, Agent, or Firm* — Dickinson Wright PLLC; Steven Hurles

(57) ABSTRACT

Non-volatile, high performance memory devices balance speed and reliability, which can include channel boosting to reduce data error rates in the memory cells. Vertical NAND strings exhibit greater program disturb (errors) the higher the wordline is on the string. The present disclosure applies a boosted bit line voltage or an increased precharge time when the programming reaches a level (wordline number) where it has been determined that errors due to program disturb may be an issue. The boost to the bit line may occur after a stored wordline value or based on a calculated number of errors at a previous wordline. In an example, the bit line stays the same as the prior world line programming operation until the likely program disturb is determined.

19 Claims, 8 Drawing Sheets

US 10,839,923 B1

PREDICTIVE BOOSTING FOR 3D NAND

TECHNICAL FIELD

This disclosure relates to memory systems, and in particular, to predictive boosting for three dimensional non-volatile memory such an NAND.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, such as a source select line and a drain select line.

SUMMARY

This disclosure relates generally to memory systems and methods that provide predictive boosting that can apply a boosted bit line voltage or an increased precharge time when the programming reaches a level (wordline number) where it has been determined that errors due to program disturb may be an issue. The boost to the bit line may occur after a stored wordline value or based on a calculated number of errors at a previous wordline. In an example, the bit line stays the same as the prior world line programming operation until the likely program disturb is determined.

An aspect of the disclosed embodiments includes a boosting method for three dimensional NAND that can include issuing a program command to a block of memory, assigning an initial bit line bias, determining a wordline being programmed, with the wordline being lower than or at a wordline threshold, and programming a memory cell at the wordline using the initial bit line bias, the wordline threshold being set at a value below which memory cells are free of program disturb and above have program disturb. In an aspect of the disclosure, the method can include, with the wordline being above the wordline threshold, increasing bit line bias to a boosted bit line bias and then programming the memory cell at the wordline using the increased bit line bias, the increased bit line bias being greater than the initial bit line bias.

In an aspect of the disclosure, with the wordline being above the wordline threshold, increasing bit line bias includes increasing a precharge time when applying the increased bit line voltage.

In an aspect of the disclosure, repeating the programming of the memory cell using the increased bit line bias and the increased precharge time for all wordlines greater than the wordline threshold can be performed.

In an aspect of the disclosure, increasing the bit line bias includes doubling the voltage on the bit line during programming above the wordline threshold.

In an aspect of the disclosure, increasing the precharge time includes increasing the precharge time by an order of magnitude.

In an aspect of the disclosure, issuing the program command allows lower memory cells closer to the silicon substrate to be programmed faster than higher memory cells in a same vertical string.

In an aspect of the disclosure, the wordline threshold is about two thirds of the wordlines.

In an aspect of the disclosure, performing an erase verify includes performing the erase after the target voltage is reached at the second end.

In an aspect of the disclosure, the method can include setting the wordline threshold by counting memory cells that exceed a detection voltage and when a number of memory cells exceed the detection voltage, assign the wordline associated with the memory cell as the wordline threshold.

In an aspect of the disclosure, a memory boosting method for three dimensional NAND includes issuing a program command to a block of memory with a plurality of vertically connected memory cells associated a bit line, assigning an initial bit line bias, determining a wordline being programmed, counting a number of memory cells below a detection voltage on the wordline, with the number of memory cells being lower than a count threshold, programming a memory cell at the wordline using the initial bit line bias, and, with the number of memory cells being above the count threshold, increasing bit line bias to a boosted bit line bias and then programming the memory cell at the wordline using the increased bit line bias, the increased bit line bias being greater than the initial bit line bias.

In an aspect of the disclosure, increasing bit line bias includes increases the bit line bias for each subsequent wordline after the number of memory cells exceeds the count threshold.

In an aspect of the disclosure, after programming at the wordline, the method steps to a next wordline and repeats the counting and programming steps.

In an aspect of the disclosure, the count threshold is about one-eighth the total memory cells on the wordline.

In an aspect of the disclosure, with the number of memory cells being above the count threshold, increasing bit line bias includes increasing a precharge time when applying the increased bit line voltage.

In an aspect of the disclosure, increasing the bit line bias includes adding a set value to the voltage on the bit line during programming above the cell threshold.

In an aspect of the disclosure, increasing the precharge time includes increasing the precharge time by a set value.

In an aspect of the disclosure, structures for performing the above methods are described, e.g., controller circuitry operably connected to three-dimensional memory, e.g., NAND.

In an aspect of the disclosure, a NAND memory includes a plurality of vertical memory strings including a plurality of memory cells, a plurality of wordlines connected to memory cells across a plurality of memory strings at a same level from a bottom of the plurality of vertical memory strings, a plurality of bit lines connected at one end of the plurality of vertical memory strings, respectively, and controller circuitry to issue signals to: start a program for a block of memory including a plurality of vertical memory strings; detect, on a wordline basis, where memory cells require at least one of a boosted bit line bias voltage, an increased precharge time, or both; apply the boosted bit line bias voltage, an increased precharge time, or both during programming for all wordlines above the current wordline.

In an aspect of the disclosure, the controller circuitry is configured to boost bit line bias voltage for each subsequent wordline after the number of memory cells exceeds an error count threshold.

In an aspect of the disclosure, the controller circuitry is configured to apply boosted bit line voltage with a wordline being positioned above a string bottom at a set position.

In an aspect of the disclosure, the controller circuitry is configured to hold the bit line voltage at a same voltage as the prior wordline with the detection not showing detecting a boost being required for a memory cell at the wordline level.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Non-volatile, high performance memory devices balance speed and reliability, which can include channel boosting to reduce data error rates in the memory cells. Vertical NAND strings in the memory device exhibit greater program disturb (e.g., errors) the higher the wordline is on the string. The present disclosure applies a boosted bit line voltage or an increased precharge time when the programming reaches a level (wordline number) where it has been determined that errors due to program disturb may be an issue. The boost to the bit line may occur after a stored wordline value or based on a calculated number of errors at a previous wordline. In an example, the bit line stays the same as the prior world line programming operation until the likely program disturb is determined.

Figure 1:
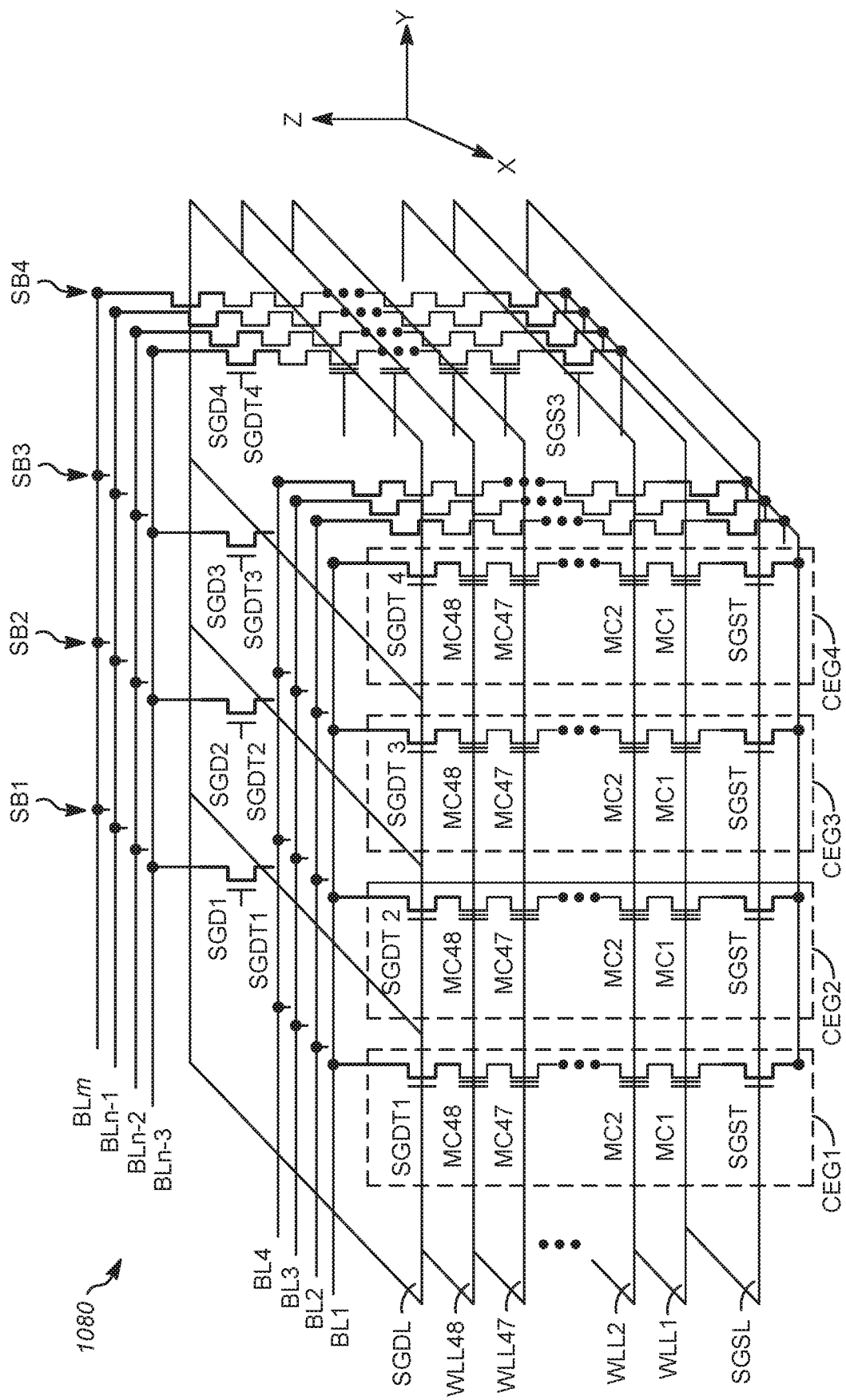
FIG. 1 shows illustrates a circuit schematic diagram of a block of memory cells three-dimensionally arranged into a plurality of NAND strings.

FIG. 1 generally illustrates a circuit schematic diagram of an example configuration of a three-dimensional memory circuit 100, which may be representative of at least a portion of a block in a NAND memory device and/or have the physical construction or structure as part of a NAND memory device. In FIG. 1, each bias element is represented or depicted as a transistor. In addition, memory cells are labeled MC, SGD transistors are labeled SGDT, and SGS transistors are labeled SGST. In the example memory circuit 100, each channel element group includes up to fifty cells, including forty eight memory cells, extending from a first memory cell MC1 to a forty-eighth memory cell MC48, one SGD transistor SGDT, and one SGS transistor SGST. Other channel element group configurations are possible, including those that include one or more source-side dummy cells, one or more drain-side dummy cells, more than one SGD transistor, and/or more than one SGS transistor, as previously described.

In accordance with the channel element group configuration in FIG. 1, the memory circuit 100 includes fifty control gate layers, including forty-eight word line layers extending from a first word line layer WLL1 to a forty-eighth word line layer WLL48, a SGD layer SGDL, and a SGS layer SGSL. The ith memory cells MCi in each channel element group are disposed in and configured to have their respective control gates biased by the ith word line layer WLLi of the control gate layers. As examples, first memory cells MC1 of the channel element groups CEG are disposed in and configured to have their control gates biased by the first word line layer WLL1, the second memory cells MC2 are disposed in and configured to have their control gates biased by the second word line layer WLL2, and the forty-eighth memory cells MC48 of the channel element groups CEG are disposed in and configured to have their control gates biased by the forty-eighth word line layer WLL48. In addition, the SGD transistors of the channel element groups are disposed in and configured to have their respective control gates biased by the SGD layer SGDL, and the SGS transistors of the channel element groups are disposed in and configured to have their respective control gates biased by the SGS layer SGSL.

The channel element groups CEG and their associated channels are two-dimensionally arranged in the x and y directions in the memory circuit 100, and electrically connected to an m-number of bit lines. In particular example configurations, the channel element groups CEG and their associated channels are two-dimensionally arranged in accordance with a channel arrangement that depends on a P-number of channel element groups and their associated channels that are connected to a single bit line. Otherwise stated, each bit line BL is configured to electrically connect to, apply a respective bit line voltage to, and/or bias with a respective bit line (channel) voltage, a unique set of a P-number of channel element groups and their associated channels.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

Additionally, or alternatively, the memory cells of a memory circuit or of the memory cell structure generally, are configured to store data as bits or binary digits, with each bit having either a logic "0" or a logic "1" binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include two, three, or four, although MLC cells that store more than four bits may be possible.

During a programming operation in the memory circuit 100, incoming data is transferred from data latch to the NAND memory cells through the bit lines (BL). There are two types of BLs, representing data "1" and "0". For data "0, the bit line corresponds to data "0" are biased to zero Volts during programming. The corresponding memory cells receive a complete programming voltage (VPGM) so that threshold voltage (Vt) increases. The voltage potential on these memory cells are VPGM. For data "1," the BL corresponds to data "1" are biased as VDDSA (e.g., about 3V) during programming. This high bias can turn off drain side select gate transistor (SGDT) such that an entire channel is boosted up well above zero Volts, (e.g., $V_{channel}$ of about 10 V) with further help from an unselected WL (e.g., VPASS is about nine Volts). The corresponding memory cells are therefore inhibited from further programming. Voltage potential on these memory cells is VPGM–$V_{channel}$. Programming the memory 100 includes three phases, namely, pre-charge, program, and verify. During pre-charge, there are three phases. The first phases (sometimes referred to as program 5, P5) the inhibit bit line is charged up with a constant current (e.g., peak current control) until a charging target (e.g., a portion of VDDSA, such as 90% VDDSA) is reached. The second phase (sometimes referred to as program 6, P6) further charges the inhibit BL without current control until final target (e.g., 100% VDDSA). The third phase (sometimes referred to as program 7, P7) holds the inhibit BL at VDDSA for a certain time.

When programming non-volatile memories, such as NAND programming, a trade-off between programming performance (e.g., speed) and reliability (e.g., channel boosting) is made. In order to allow proper channel boosting (e.g., a high $V_{channel}$), the inhibit BL voltage should be as high as possible. However, the inhibit BL high voltage (VDDSA~3V) is strongly coupled to programming BL low voltage (zero Volts) through BL-BL capacitive coupling (RC-delay). As a result, program performance is slowed down as it is necessary to wait until the BL voltage signal is fully stable in each programming pulse. On the other hand, to achieve faster BL charging speed by using a lower inhibit BL voltage, severe reliability issues may occur, e.g., inhibit cells are not inhibited properly which may show as a larger Er-state upper tail. This trade-off is especially problematic for QLC (X4, 4 bit per cell) technology where the memory device requires a super strong boosting to prevent program disturb for a particular groups of WLs (usually the higher WLs), while the memory device also needs to be as fast as possible for regular WLs (usually the lower WLs), see FIG. 2. In an example, under the same boosting configuration, the Er upper tail of the lower WLs are good (i.e. less program disturb), while higher WLs are bad (i.e. severe program disturb). Aspects of the present disclosure provides method to automatically find those "bad WLs" and allows an adaptive precharge boosting to prevent these "bad WLs" from being disturbed while still maintain an overall fast program performance.

Figure 2:
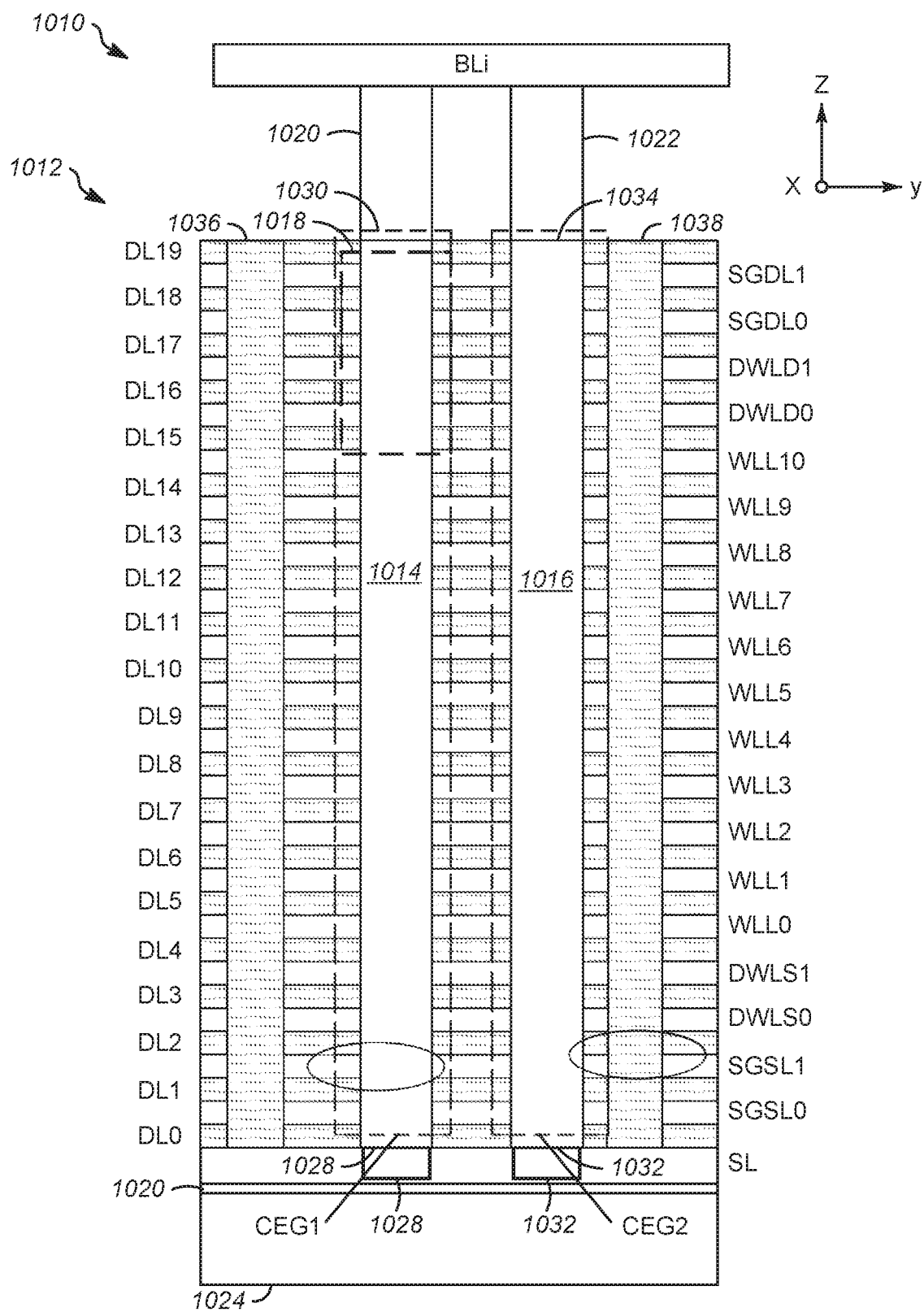
FIG. 2 shows a schematic view of a nonvolatile memory according to an aspect of the present disclosure.

In further detail, FIG. 2 generally illustrates a cross-sectional view of a portion of a memory circuit 100. The memory circuit 100 includes a stack 1012 of alternating control gate layers and dielectric layers (DL). In addition, the portion generally illustrated in FIG. 2 includes two channels (or memory holes) extending through the layers, including a first channel 1014 and a second channel 1016. Bias elements forming two memory channel element groups around the two channels 1014, 1016 are identified by dotted boxes in FIG. 2. In particular, bias elements forming a first channel element group CEG1 around the first channel 1014 are identified by a dotted box labeled CEG1, and bias elements forming a second channel element group CEG2 around the second memory hole 1016 are identified by a dotted box labeled CEG2.

For purposes of illustration, in FIG. 2, the first and second channel element groups CEG1, CEG2 formed around the first and second channels 1014, 1016 are both electrically connected to an ith bit line BLi. In actual implementation, a block may include hundreds or thousands of bit lines. An arrangement of channels and associated channel element groups of a block may determine which channels and channel element groups are electrically connected to which bit lines. Among the plurality of channels and channel element groups of a block, certain combinations of channels and associated channel element groups are electrically connected to the same bit line as each other, while certain other combinations of channels and associated channel element groups are electrically connected to different bit lines from each other.

In addition, a given channel element group may be electrically connected to a given bit line by way of its associated channel and a conductive via electrically connecting the associated channel with the bit line. For example, in FIG. 2, the first channel element group CEG1 is electrically connected to the ith bit line BLi by way of the first channel 1014 and a conductive via 1020 that electrically connects the first channel 1014 with the ith bit line BLi. The second channel element group CEG2 is electrically connected to the ith bit line BLi by way of the second channel 1016 and a conductive via 1022 that electrically connects the second channel 1016 with the ith bit line BLi. Other ways of electrically connecting bit lines with channel element groups may be possible.

The memory circuit 100 may further include or be disposed on a substrate 1024. An insulating film may be formed on the substrate 1024, and a source line SL may be formed or disposed on a bottom-most layer of the stack 1012.

In addition, in the example configuration illustrated in FIG. 2, each channel 1014, 1016 includes a source end connected to the source line SL, and a drain end connected to its associated conductive via. In FIG. 2, the first channel 1014 includes a source end 1028 connected to the source line SL, and a drain end 1030 connected to the conductive via 1020. Similarly, the second channel 1016 includes a source end 1032 connected to the source line SL, and a drain end 1034 connected to the conductive via 1022.

In addition, at least some example configurations, the memory circuit 100 may further include vertical interconnects (e.g., metal-filled slits) extending through the stack 1012 that connect the source line SL to a conductive line above the stack 1012, such as a conductive line in one of the metal layers in the upper region 1008. For purposes of illustration, FIG. 2 generally illustrates two interconnects 1036, 1038 extending through the stack 1012.

In addition, in the example configuration in FIG. 2, for purposes of illustration, each of the channel element groups include two SGS transistors, two source-side dummy cells, eleven memory cells, two drain-side dummy cells, and two SGD transistors. Accordingly, the control gate layers of the stack 1012 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGSL0 and a second SGD layer SGDL1. The stack further includes twenty dielectric layers, extending from a first dielectric layer DL0 to a twentieth dielectric layer DL19, alternatingly disposed between the control gate layers.

The numbers of bias elements and their respective bias element types used for the channel element groups and the number of corresponding control gate layers in the example configuration of the memory circuit 100 in FIG. 2 are non-limiting and merely exemplary for purposes of illustration. Other numbers of bias elements for any of the bias element types, or other configurations that do not include bias elements of certain bias elements types or that include one or more bias elements of bias element types other than those illustrated in FIG. 2, may be possible.

The wordlines can have good wordlines at the lower wordlines, e.g., WLL0-WLL5, while the higher wordlines, e.g., WLL6-WLL10, generally have greater program disturb. Thus, the higher wordlines require stronger boosting. The methods described herein identify the bad wordlines and then provide an adaptive precharge in the programming to account to these bad wordlines.

Figure 3:
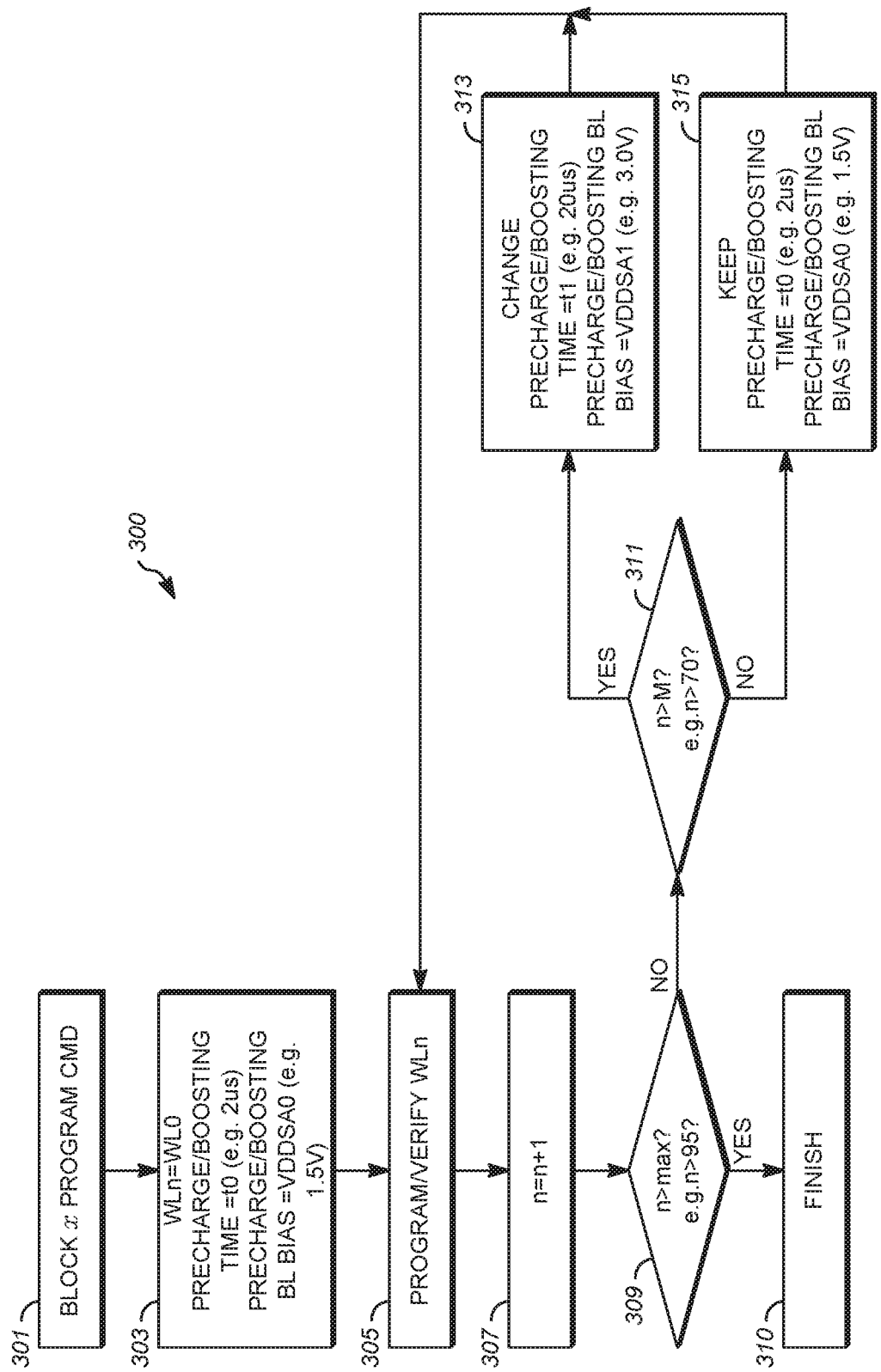
FIG. 3 shows a flow chart for a wordline boosting method according to an aspect of the present disclosure.

FIG. 3 shows a flow chart 300 for identifying wordlines that require a greater precharge boost. At 301, a program command is issued from a memory controller. The program command can be directed to a specific block of memory. At 303, the wordline being evaluated is set to the zero of first wordline, e.g., WLn=WLL0. The precharge/boosting time for the WLn is set to the base time period, to (e.g., 2 µs). The precharge/boosting bit line (BL) bias is set to VDDSA0 (e.g., 1.5V). At 305, the program or verify of WLn is performed. At 307, the counter of the wordline is incremented by one, e.g., n=n+1. At 309, it is determined if the n is greater than the maximum wordline, e.g., ninety-five or in the illustrated embodiment of FIG. 2, n is eleven. If step 309 is yes, then the process ends at 310. If at 309, the maximum has not been reached, then the process proceeds to step 311. At 311, it is determined if n>M, where M is the dividing level of the wordlines that move from a lower wordline that does not require additional boost and the upper wordlines that require the additional boost. If yes at 311, then at 313 the boosting value is changed. The changes can include increasing the precharge or boost time period, e.g., from $t_0$ to $t_1$. The time $t_1$ can be twice as long as to or an order magnitude longer than to. The precharge/boosting bit line (BL) bias is increased, e.g., 50% increase or double from the prior bit line bias. For example, the bit line bias can be set to VDDSA1 such as 3.0 Volts. The process then returns to step 305 to program or verify the wordline, WLn. If at the 311, the wordline WLn is less than the threshold for the precharge boost of 313, then the process moves to 315. At 315, the precharge/boost time stays at to. The precharge/boosting bit line bias stays at VDDSA0 (e.g., 1.5 V). The process then returns to 305.

The process 300 provides a pre-defined boosting mode. This is based on silicon experience, in which a first set of wordlines, e.g., WL0-WL69 (or WLL0-WLL5 in FIG. 2) do not have program disturb issue, so a smaller inhibit voltage (VDDSA0) and shorter precharge time (to) can be used to speed up program performance. The higher wordlines, e.g., WL70-WL95 (or WLLL6-10 in FIG. 2) are more easily disturbed, so a larger inhibit voltage (VDDSA1) and longer precharge time ($t_1$) can be used to prevent program disturb (with performance trade-off). The program trade-off is only applied to the wordlines that are likely to have a disturb.

Aspects of the present disclosure may provide a predictive method which uses WLn program disturb situation to predict WLn+1 program disturb by counting number of cells below a detection voltage after WLn programming finishes. If the prediction suggests a higher risk of program disturb, then a stronger precharge/boosting is applied during WLn+1 program. Aspects of the present disclosure adaptively prevents program disturb while maintains the fastest/best program performance.

Figure 4:
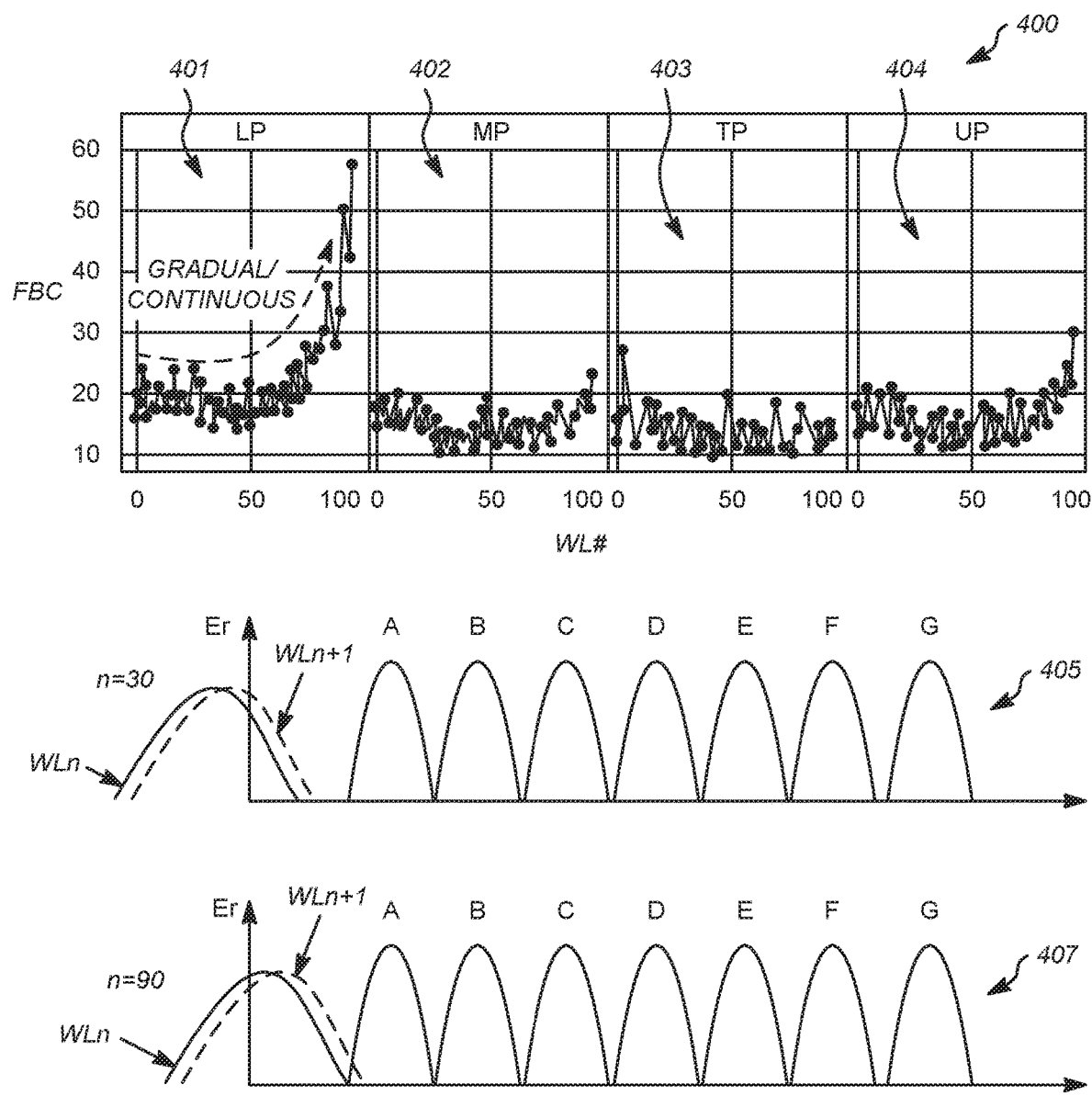
FIG. 4 generally illustrates diagrams of a failed bit count for a low page, middle page, top page and upper page of memory, an error count for lower wordlines, and an error count for upper wordlines according to an aspect of the present disclosure.

FIG. 4 illustrates a schematic view 400 of a prediction of whether a wordline needs an increase in the precharge/boost. The graph 401 shows the wordline number for four pages of wordlines and the proposed failed bit count ("FBC") or error rate method may be based on the error rate measurement, approximated by taking multiple reads and measuring the FBC and by using the optimal read thresholds. The curves 401, 402, 403, 404 for the different pages in memory show that the program disturb results in a relatively linearly manner.

The graph 405 shows the distribution of multiple storage states A-G, with the errors Er being counted for the lower wordlines, e.g., wordlines 30 or less or WLL1-WLL5 in FIG. 2. The WLn errors are predictive of the WLn+1 errors. The graph 405 shows that less program disturb for WLn predicts less program disturb for the next wordline, WLn+1.

The graph 407 shows the distribution of multiple storage states A-G, with the errors Er being counted for the higher wordlines, e.g., wordlines 31 or more or WLL6-WLL10 in FIG. 2. The WLn errors are predictive of the WLn+1 errors. The graph 407 shows that if program disturb for WLn is high, it predicts more likely program disturb for the next wordline, WLn+1.

Figure 5:
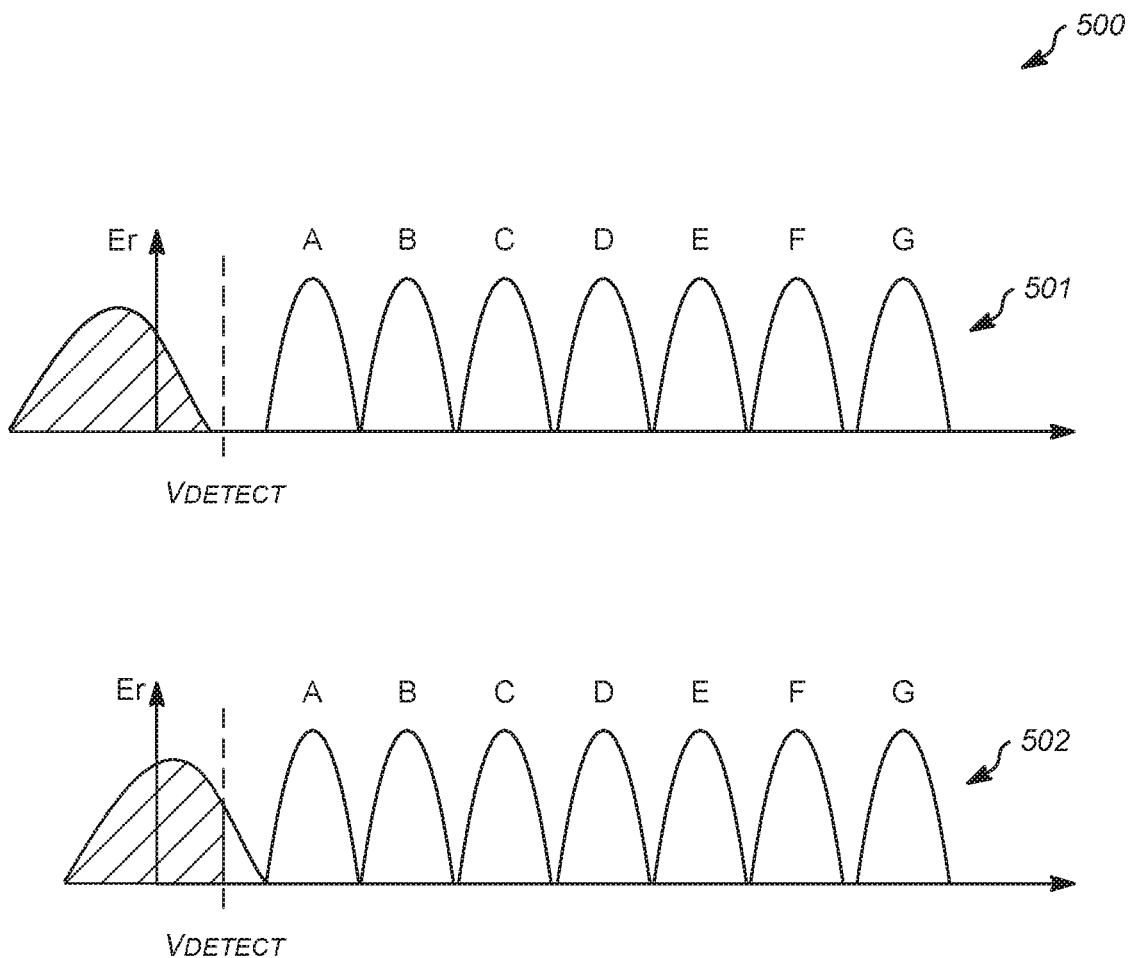
FIG. 5 generally illustrates diagrams showing cell counts with errors and ay a coorect state relative to a detection voltage according to an aspect of the present disclosure.

FIG. 5 illustrates a detection methodology 500 to set the divide between the lower and upper wordlines at which the wordlines move from low likelihood of disturb to a higher likelihood of disturb. The method can count the number of memory cells below Vdetect, e.g., 0.6 Volts, to determine if the error Er upper tail is high or low, e.g., the program disturb is below or above a threshold at which a greater precharge/boost is needed. The graph 501 shows that the number of memory cells below Vdetect is N, with N being about ⅛ the total number of cells. The Er upper tail is low and no program disturb occurs. The graph 502 the number of cells below Vdetect is M, with M being less than ⅛ of the total cells. The upper tail of Er is high and thus there is a sever program disturb and these wordlines require the greater precharge boost and/or need a longer charge time.

Figure 6:
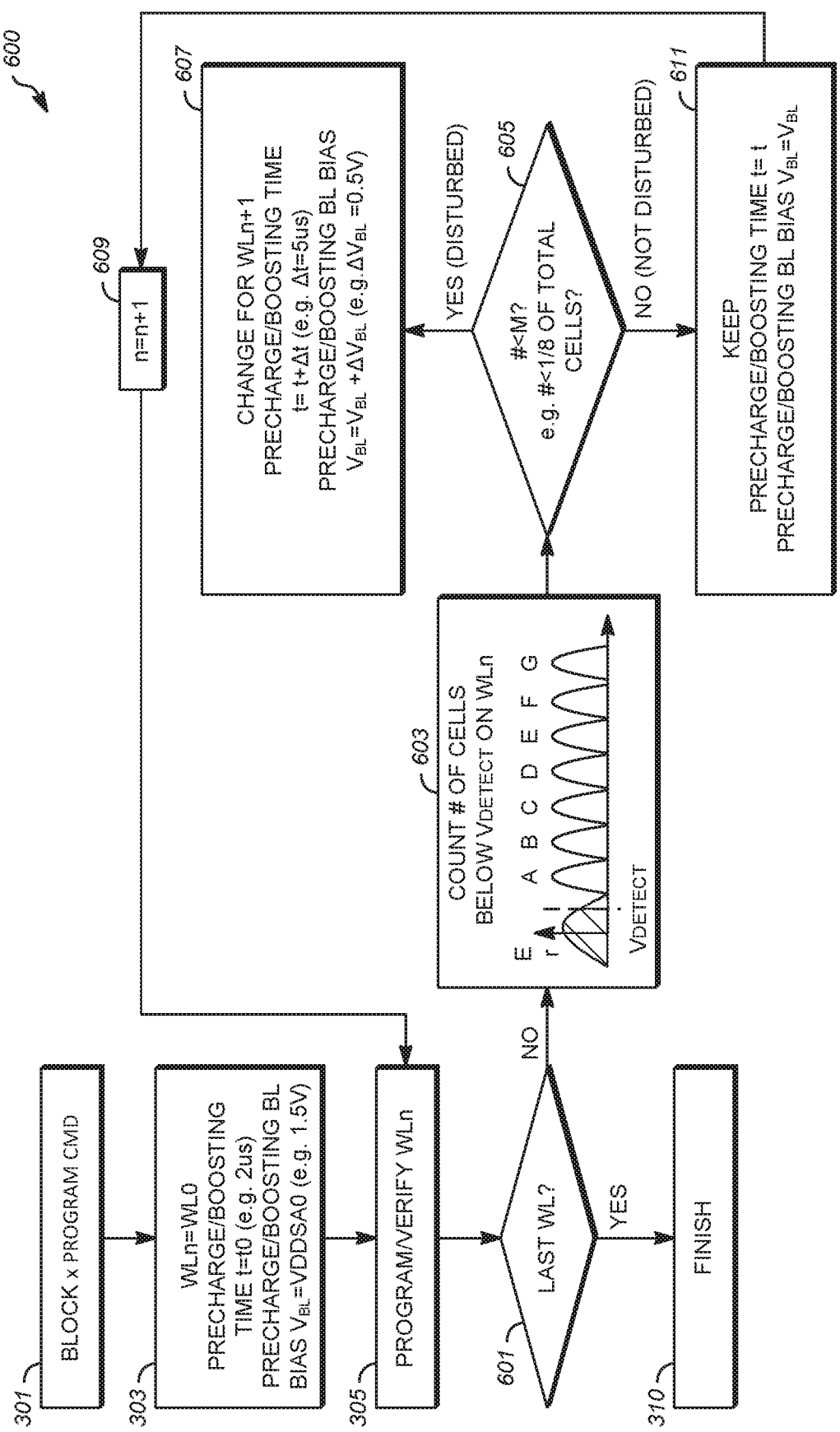
FIG. 6 generally illustrates a flow chart of for a wordline boosting method according to an aspect of the present disclosure.

FIG. 6 illustrates a flow chart 600 for identifying wordlines that require a greater precharge boost with elements similar to the flow chart 300 being labelled with the same reference numbers. At 301, a program command is issued from a memory controller. At 303, the wordline being evaluated is set to the zero of first wordline, e.g. WLn=WLL0. The precharge/boosting time for the WLn is set to the base time period, to (e.g., 2 µs). The precharge/boosting bit line (BL) bias is set to VDDSA0 (e.g., 1.5 V). At 305, the program or verify of WLn is performed. At 601, it is determined if WLn is the last wordline. If step 305 is yes, then the process ends at 310. If at 309, the last wordline has not been reached, then the number of memory cells N on WLn below Vdetect are counted at step 603. At step 605 it is determined if N<M, where M is the dividing level of the wordlines that move from a lower wordline that does not require an additional boost and the upper wordlines that require the additional boost. If yes at 605, then at 607, the boosting value is changed. The changes can include incrementally changing the precharge or boost time period, e.g., t=t+Δt (in one embodiment, Δt=5 µs). The changes can also include increasing the precharge/boosting bit line (BL) bias, Vbl=Vbl+ΔVbl (in one embodiment, ΔVbl=0.5 V). If no at 605, then the process moves to 611 where the precharge and boosting time period and the precharge and boosting bit line (BL) bias remain unchanged. In either scenario, the process moves on to step 609 where the counter of the wordline is incremented by one, e.g., n=n+1. The process then returns to step 305.

Figure 7:
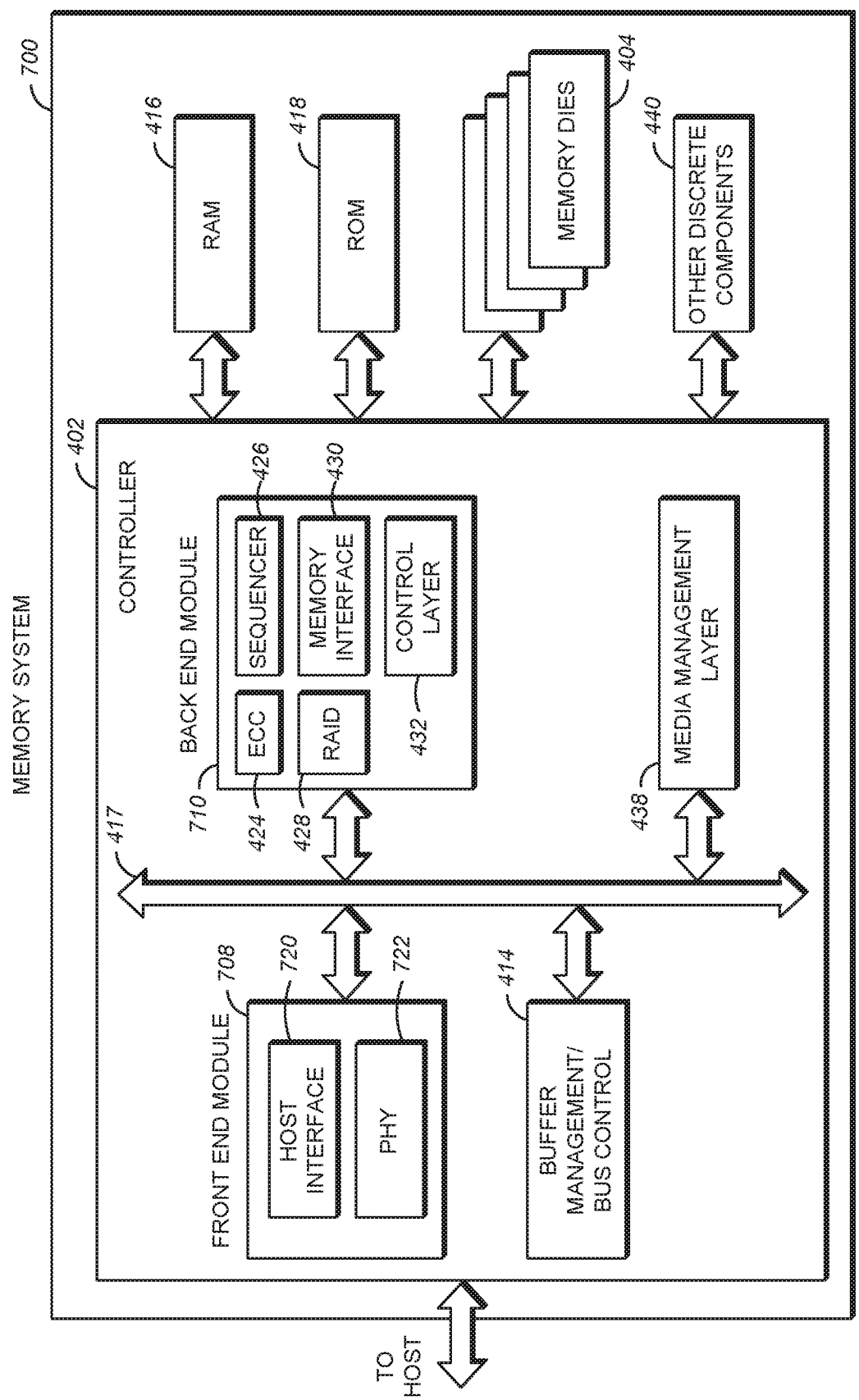
FIG. 7 generally illustrates a block diagram of an example configuration of components of a controller of the three-dimensional NAND memory according to an aspect of the present disclosure.

FIG. 7 is a block diagram illustrating exemplary components of the memory controller. The controller 402 may include a front end module 708 that interfaces with a host, a back end module 710 that interfaces with the non-volatile memory die(s) 404, and various other modules that perform various functions of the non-volatile memory system 700. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 402 may include a buffer manager/bus controller module 414 that manages buffers in random access memory (RAM) 416 and controls the internal bus arbitration for communication on an internal communications bus 417 of the controller 402. A read only memory (ROM) 418 may store and/or access system boot code. Although illustrated in FIG. 6 as located separately from the controller 402, in other embodiments one or both of the RAM 416 and the ROM 418 may be located within the controller 402. In yet other embodiments, portions of RAM 416 and ROM 418 may be located both within the controller 402 and outside the controller 402. Further, in some implementations, the controller 402, the RAM 416, and the ROM 418 may be located on separate semiconductor dies.

Additionally, or alternatively, the front-end module 708 may include a host interface 720 and a physical layer interface (PHY) 722 that provide the electrical interface with the host or next level storage controller. The choice of the type of the host interface 720 can depend on the type of memory being used. Example types of the host interface 720 may include, but are not limited to, SATA, SATA Express, SAS, Fibre Channel, USB, PCIe, and NVMe. The host interface 720 may typically facilitate transfer for data, control signals, and timing signals.

The back end module 710 may include an error correction code (ECC) engine or module 424 that encodes the data bytes received from the host, and decodes and error corrects the data bytes read from the non-volatile memory die(s) 404. The back end module 710 may also include a command sequencer 426 that generates command sequences, such as program, read, and erase command sequences, to be transmitted to the non-volatile memory die(s) 404. Additionally, or alternatively, the back end module 710 may include a RAID (Redundant Array of Independent Drives) module 728 that manages generation of RAID parity and recovery of failed data. The RAID parity may be used as an additional level of integrity protection for the data being written into the non-volatile memory system 700. In some cases, the RAID module 428 may be a part of the ECC engine 424. A memory interface 430 provides the command sequences to the non-volatile memory die(s) 404 and receives status information from the non-volatile memory die(s) 404. Along with the command sequences and status information, data to be programmed into and read from the non-volatile memory die(s) 404 may be communicated through the memory interface 430. In one embodiment, the memory interface 430 may be a double data rate (DDR) interface and/or a Toggle Mode 200, 400, 800, or higher interface. A control layer 432 may control the overall operation of back end module 710.

Additional modules of the non-volatile memory system 700 illustrated in FIG. 7 may include a media management layer 438 that performs certain memory management functions such as wear leveling of memory cells of the memory dies 404, address management, and facilitates folding operations. Other memory management functions may be possible. The non-volatile memory system 400 may also include other discrete components 440, such as external electrical interfaces, external RAM, resistors, capacitors, or other components that may interface with the controller 402. In alternative embodiments, one or more of the RAID module 428, media management layer 438 and buffer management/bus controller 414 are optional components that may not be necessary in the controller 402.

Figure 8:
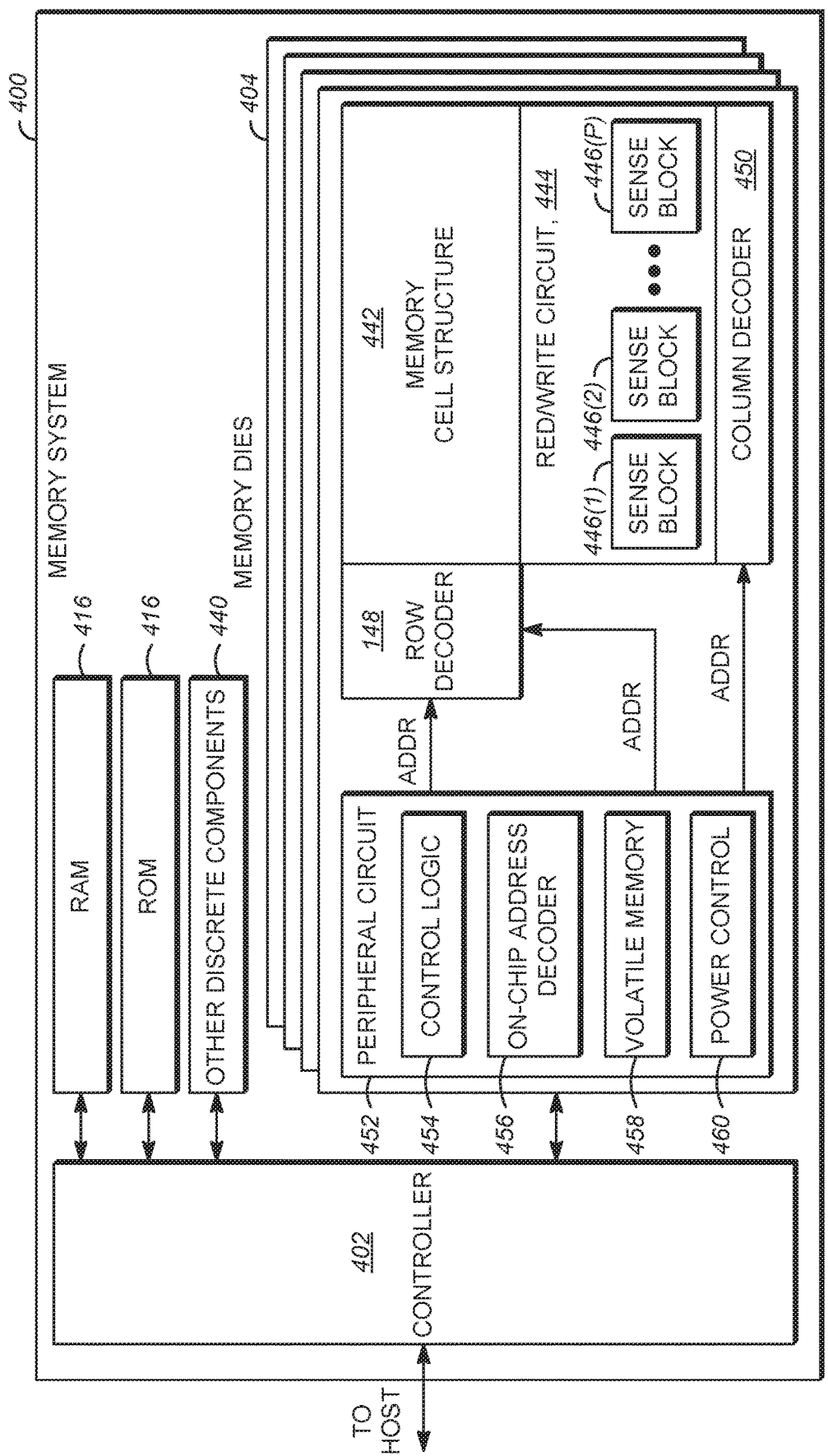
FIG. 8 generally illustrates a block diagram of an example configuration of components of a memory die of the three-dimensional NAND memory according to an aspect of the present disclosure.

FIG. 8 is a block diagram of an example configuration of components of a memory die 404 in more detail. The memory die 404 may include a memory cell structure 442 that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure 442. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 442 of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon.

In addition, a plurality of memory cells that form the entire memory cell structure 442, or at least a portion of the memory cell structure 442, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible. In an example embodiment, the SGST transistors are the switches 100, 200. In an example embodiment, the SGS transistors are the switches 100, 200.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing type of bias elements and/or the same types of terminals of the bias elements.

For NAND technology, the control lines of a block may be organized into three main types, including control gate lines, bit lines, and source lines. A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements. In particular example configurations, a bit line biases drain terminals by applying its bit line voltage to one or more drain ends or sides of one or more channel element groups and/or associated channels, and/or by biasing one or more drain ends or sides of one or more channel element groups and/or associated channels with a bit line voltage. In this context, a bit line voltage may alternatively be referred to as a drain-side channel voltage (or just drain-side voltage). Herein, the terms bit line voltage, drain voltage, drain-side voltage, and drain-side channel voltage are used interchangeably, at least as those voltages pertain to NAND technology, unless expressly described otherwise. Channel element groups, channels, and their drain ends are described in further detail below.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more channel element groups and/or associated channels, and/or by biasing one or more source ends or sides of one or more channel element groups and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Additionally, or alternatively, the source line of a block may alternatively be referred to as a cell source line CELSRC. Channel element groups, channels, and their source ends are described in further detail below.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage (e.g., the high level, the erase verify level or the low level) to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, or alternatively, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular, example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

Drain ends of channel element groups are electrically coupled to drain ends of their associated channels. Accordingly, the bit lines are electrically connected or coupled to drain ends of channels and associated channel elements groups. A bit line is configured to apply a bit line voltage (or a drain voltage, a drain-side channel voltage, or a drain-side voltage) to drain ends of channels and associated channel element groups to which the bit line is coupled. Otherwise stated, a bit line voltage (or a drain voltage, a drain-side channel voltage, or a drain-side voltage) is a voltage that a bit line generates and that it applies to a drain end (or drain side) of a channel and/or a drain end (or drain side) of a channel element group to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, source ends of channel element groups are electrically coupled to source ends of their associated channels. Accordingly, the source line is electrically connected or coupled to source ends of channels and associated channel elements groups. The source line is configured to apply a source line voltage (or a source voltage, a source-side channel voltage, or a source-side voltage) to source ends of channels and associated channel element groups to which the source line is coupled. Otherwise stated, a source line voltage (or a source voltage, a source-side channel voltage, or a source-side voltage) is a voltage that a source line generates and that it applies to a source end (or source side) of a channel and/or a source end (or source side) of a channel element group to which the source line is electrically connected or coupled. During at least some memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. Additionally, or alternatively, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

The numbers of bias elements and their respective bias element types used for the channel element groups and the number of corresponding control gate layers in the example configuration of the memory 100 in FIG. 1 are non-limiting and merely exemplary for purposes of illustration. Other numbers of bias elements for any of the bias element types, or other configurations that do not include bias elements of certain bias elements types or that include one or more bias elements of bias element types other than those illustrated in FIG. 1, may be possible.

In general, certain collections of memory cells are configured to store the same number of bits. For example, memory cells that are part of the same word line cell group, part of the same block, or part of the same memory cell structure, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure, including blocks and word line cell groups of the memory cell structure, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular, embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

In addition, the memory as described herein may include a power control circuit that is configured to generate and supply control line voltages (including voltage pulses) to control lines of the memory cell structures. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit also be configured to generate and/or supply voltages other than the control lines voltages, including other voltages that may be supplied to the memory cell structure, the read/write circuits, the sense blocks, and/or other circuit components on the memory die 404.

The power control circuit may include any of various circuit topologies or circuit configurations to generate and/or supply the voltages at appropriate levels to perform memory operations, (including read, program/write, sense, verify and erase operations), such as driver circuits, current sources, charge pumps, reference voltage generators, regulators, and pulse generation circuits, or any of various combinations thereof. Other types of circuits to generate the voltages may be possible. In addition, the power control circuit may communicate with and/or be controlled by the control logic circuit, the read/write circuits, and/or the sense blocks in order to supply the voltages at appropriate levels and at appropriate times to carry out the memory operations.

During read operations, the power control circuit may bias word lines at read threshold voltage levels Vr in order to read the data values of the data that the memory cells are storing. A threshold voltage level Vr for a given memory state may have different optimum values for different operating conditions, including different process conditions, different program/erase cycles, different retention times, different temperatures, different disturb conditions, or combinations thereof. For a given storage scheme, the memory system, at the controller side, and/or at the memory die side, may maintain a data structure, such as a table, that identifies one or more sets of read threshold levels for the power control circuit to use to bias the word lines during read operations. The data structure may include multiple sets of read threshold levels; each corresponding to a different area of the memory dies 404.

The memory system 400 may be configured to perform a read threshold calibration process that updates or revises one or more sets of the read threshold levels maintained in the data structure to more optimal values corresponding to changes in operating conditions. In various embodiments described herein, the read threshold calibration process that the memory system 400 performs may be based on bit error rates (BERs) determined from data read from the memory dies 404. The data read from the memory dies 404 to perform the calibration may be performed in response to host read requests. In addition or alternatively, the calibration may be a continuous process, such as a process continuously performed as host read requests are received, rather than as a discrete background process triggered by a certain metric, such as program/erase cycle count, as an example. Also, the calibration process may leverage the way in which the read/write circuit reads data based on pages (e.g., lower, middle, upper) in order to determine voltage bins across a threshold voltage range over which the threshold voltage distribution curves extend, and BERs for those bins. Based on the determined BERs, the memory system 400 may determine in which direction to shift a read voltage level (increase or decrease), and by how much.

In further detail, the read/write circuit may execute a read operation to read one or more pages of data from the memory dies 404. To do so, the read/write circuit may execute the read operation in a sequence of stages dependent on the page types. For example, to read data from a page of MLC cells configured to store two bits-per-cell, the read/write circuit may read the lower page first in a first stage, and then the upper page in a second stage. As another example, to read data from a page of MLC cells configured to store three bits-per-cell, the read/write circuit may read the lower page first in a first stage, then the middle page in a second stage, and then the upper page in a third stage.

To read a given page, sense circuits of the sense blocks, coupled to the memory cells storing the page, perform a predetermined number of sense operations, each with the word lines coupled to the memory cells biased at an associated one of the read threshold voltage levels Vr. For an SLC storage scheme, the power control circuit biases the word lines with the threshold voltage VrA associated with program state A, and the sense circuits perform a single sense operation. In response to the sense operation, the sense circuits identify those SLC cells in the erase state Er as storing a logic 1 value, and identify those SLC cells in memory state A as storing a logic 0 value. The erase verify may use the wordline charging methods are described herein.

For MLC storage schemes, to read a given page, sense circuits coupled to the memory cells storing the page perform multiple sense operations, such as two, three, or four sense operations, each with the word lines biased at a different one of the read threshold voltage levels Vr. The read threshold levels Vr that are applied depend on how many bits-per-cell the MLC cells are storing, which page is being read, and which number sense operation is being performed. In one example three bits-per-cell MLC storage scheme, to read a lower page, the sense circuits perform two sense operations, including a first sense operation with the word lines biased at the read threshold level VrA associated with memory state A, and a second sense operation with the word lines biased at the read threshold level VrE associated with memory state E. Read threshold voltage levels VrA and VrE applied during first and second sense operations.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. A boosting method for three dimensional NAND, comprising:
    issuing a program command to a block of memory;
    assigning an initial bit line bias;
    determining a wordline being programmed;
    with the wordline being lower than or at a wordline threshold, programming a memory cell at the wordline using the initial bit line bias, the wordline threshold being set at a value below which memory cells are free of program disturb and above have program disturb; and
    with the wordline being above the wordline threshold, increasing bit line bias to a boosted bit line bias and then programming the memory cell at the wordline using the increased bit line bias, the increased bit line bias being greater than the initial bit line bias.

2. The method of claim 1, wherein with the wordline being above the wordline threshold, increasing bit line bias includes increasing a precharge time when applying the increased bit line voltage.

3. The method of claim 2, further comprising repeating the programming of the memory cell using the increased bit line bias and the increased precharge time for all wordlines greater than the wordline threshold.

4. The method of claim 3, wherein increasing the bit line bias includes doubling the voltage on the bit line during programming above the wordline threshold.

5. The method of claim 4, wherein increasing the precharge time includes increasing the precharge time by an order of magnitude.

6. The method of claim 5, wherein issuing the program command allows lower memory cells closer to the silicon substrate to be programmed faster than higher memory cells in a same vertical string.

7. The method of claim 1, wherein the wordline threshold is about two thirds of the wordlines.

8. The method of claim 7, wherein performing an erase verify includes performing the erase after the target voltage is reached at the second end.

9. The method of claim 1, further comprising setting the wordline threshold by counting memory cells that exceed a detection voltage and when a number of memory cells exceed the detection voltage, assign the wordline associated with the memory cell as the wordline threshold.

10. A boosting method for three dimensional NAND, comprising:
    issuing a program command to a block of memory with a plurality of vertically connected memory cells associated a bit line;
    assigning an initial bit line bias;
    determining a wordline being programmed;
    counting a number of memory cells below a detection voltage on the wordline
    with the number of memory cells being lower than a count threshold, programming a memory cell at the wordline using the initial bit line bias; and
    with the number of memory cells being above the count threshold, increasing bit line bias to a boosted bit line bias and then programming the memory cell at the wordline using the increased bit line bias, the increased bit line bias being greater than the initial bit line bias.

11. The method of claim 10, wherein increasing bit line bias includes increasing the bit line bias for each subsequent wordline after the number of memory cells exceeds the count threshold.

12. The method of claim 11, further comprising, after programming at the wordline, stepping to a next wordline and repeating the counting and programming steps.

13. The method of claim 10, wherein the count threshold is about one-eighth the total memory cells on the wordline.

14. The method of claim 10, wherein with the number of memory cells being above the count threshold, increasing bit line bias includes increasing a precharge time when applying the increased bit line voltage.

15. The method of claim 14, wherein increasing the bit line bias includes adding a set value to the voltage on the bit line during programming above the cell threshold.

16. The method of claim 15, wherein increasing the precharge time includes increasing the precharge time by a set value.

17. A NAND memory, comprising:
    a plurality of vertical memory strings including a plurality of memory cells;
    a plurality of wordlines connected to memory cells across a plurality of memory strings at a same level from a bottom of the plurality of vertical memory strings;
    a plurality of bit lines connected at one end of the plurality of vertical memory strings, respectively;
    controller circuitry to issue signals to:
        start a program for a block of memory including a plurality of vertical memory strings;
        detect, on a wordline basis, where memory cells require at least one of a boosted bit line bias voltage, an increased precharge time, or both;
        applying the boosted bit line bias voltage, an increased precharge time, or both during programming for each subsequent wordline after the number of memory cells in a wordline exceeds an error count threshold.

18. The NAND memory of claim 17, wherein the controller circuitry is configured to apply boosted bit line voltage with a wordline being positioned above a string bottom at a set position.

19. The NAND memory of claim 17, wherein the controller circuitry is configured to hold the bit line voltage at a same voltage as the prior wordline with the detection not showing detecting a boost being required for a memory cell at the wordline level.

* * * * *